(12) United States Patent
Reynov et al.

(10) Patent No.: US 6,668,242 B1
(45) Date of Patent: Dec. 23, 2003

(54) EMULATOR CHIP PACKAGE THAT PLUGS DIRECTLY INTO THE TARGET SYSTEM

(75) Inventors: Boris Reynov, San Jose, CA (US); Andreas Wenzel, Grenoble (FR)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/160,919

(22) Filed: Sep. 25, 1998

(51) Int. Cl.[7] ............................................... G06F 9/455
(52) U.S. Cl. .......................... 703/28; 703/23; 703/27; 702/117; 257/678; 257/686; 257/724
(58) Field of Search ................. 257/678, 685, 257/686, 692, 693, 696, 697, 704, 690, 724; 703/23, 28, 27; 438/109, 103; 702/117

(56) References Cited

U.S. PATENT DOCUMENTS

| | | | | |
|---|---|---|---|---|
| 4,084,869 A | * | 4/1978 | Yen .............................. | 439/651 |
| 4,696,525 A | * | 9/1987 | Coller et al. ................... | 439/69 |
| 4,847,805 A | | 7/1989 | Ishii et al. .................... | 364/900 |
| 4,853,626 A | * | 8/1989 | Resler ......................... | 324/73.1 |
| 4,901,259 A | * | 2/1990 | Watkins ................... | 395/500.23 |
| 5,200,648 A | | 4/1993 | Vyas ........................... | 307/269 |
| 5,226,047 A | * | 7/1993 | Catlin .......................... | 714/28 |
| 5,325,512 A | | 6/1994 | Takahashi ................... | 395/500 |
| 5,339,262 A | * | 8/1994 | Rostoker et al. ........ | 395/500.05 |
| 5,391,082 A | * | 2/1995 | Airhart ......................... | 439/68 |
| 5,430,862 A | | 7/1995 | Smith et al. ................. | 395/500 |
| 5,434,450 A | * | 7/1995 | Kozono ....................... | 257/690 |
| 5,448,717 A | | 9/1995 | Balmer et al. ............... | 395/550 |
| 5,572,409 A | * | 11/1996 | Nathan et al. ............... | 174/261 |
| 5,572,665 A | | 11/1996 | Nakabayashi .......... | 395/183.04 |
| 5,572,710 A | | 11/1996 | Asano et al. ................ | 395/500 |
| 5,579,207 A | * | 11/1996 | Hayden et al. ............. | 174/261 |
| 5,594,890 A | * | 1/1997 | Yamaura et al. ........ | 395/500.44 |
| 5,629,876 A | * | 5/1997 | Huang et al. ............... | 702/117 |
| 5,731,227 A | * | 3/1998 | Thomas ...................... | 438/125 |
| 5,743,748 A | * | 4/1998 | Takahata et al. ............ | 439/482 |
| 5,781,759 A | * | 7/1998 | Kashiwabara ............... | 324/754 |
| 5,805,865 A | * | 9/1998 | Mimura et al. ........ | 395/500.49 |
| 5,973,403 A | * | 10/1999 | Wark .......................... | 257/686 |
| 6,195,268 B1 | * | 2/2001 | Eide ............................ | 361/803 |
| 6,297,720 B1 | * | 10/2001 | Lu et al. ..................... | 336/192 |

\* cited by examiner

Primary Examiner—William Thomson
Assistant Examiner—Fred Ferris
(74) Attorney, Agent, or Firm—Fish & Richardson P.C.

(57) ABSTRACT

The present invention relates to electronic packaging and a method for manufacturing the same. According to an embodiment of the present invention, an emulator chip package is designed and assembled such that a bottom portion of the emulator chip package is approximately the same electronic package used to package the target chip. Additionally, a top portion of the emulator chip package is approximately a slightly modified version of the same type of package used to package the target chip. According to an embodiment of the present invention, the top portion of the emulator chip package is attached to the bottom portion of the emulator chip package. The lead connector pins of the top portion of the package preferably leads up, while the connector pins of the bottom portion of the package preferably leads down.

11 Claims, 8 Drawing Sheets

EMULATOR CHIP PACKAGE THAT PLUGS DIRECTLY INTO THE TARGET SYSTEM

FIELD OF THE INVENTION SECTION

The present invention relates to testing and simulation of a microprocessor chip. In particular, the present invention relates to an emulation package for an emulation chip.

BACKGROUND OF THE INVENTION

Figure 1:
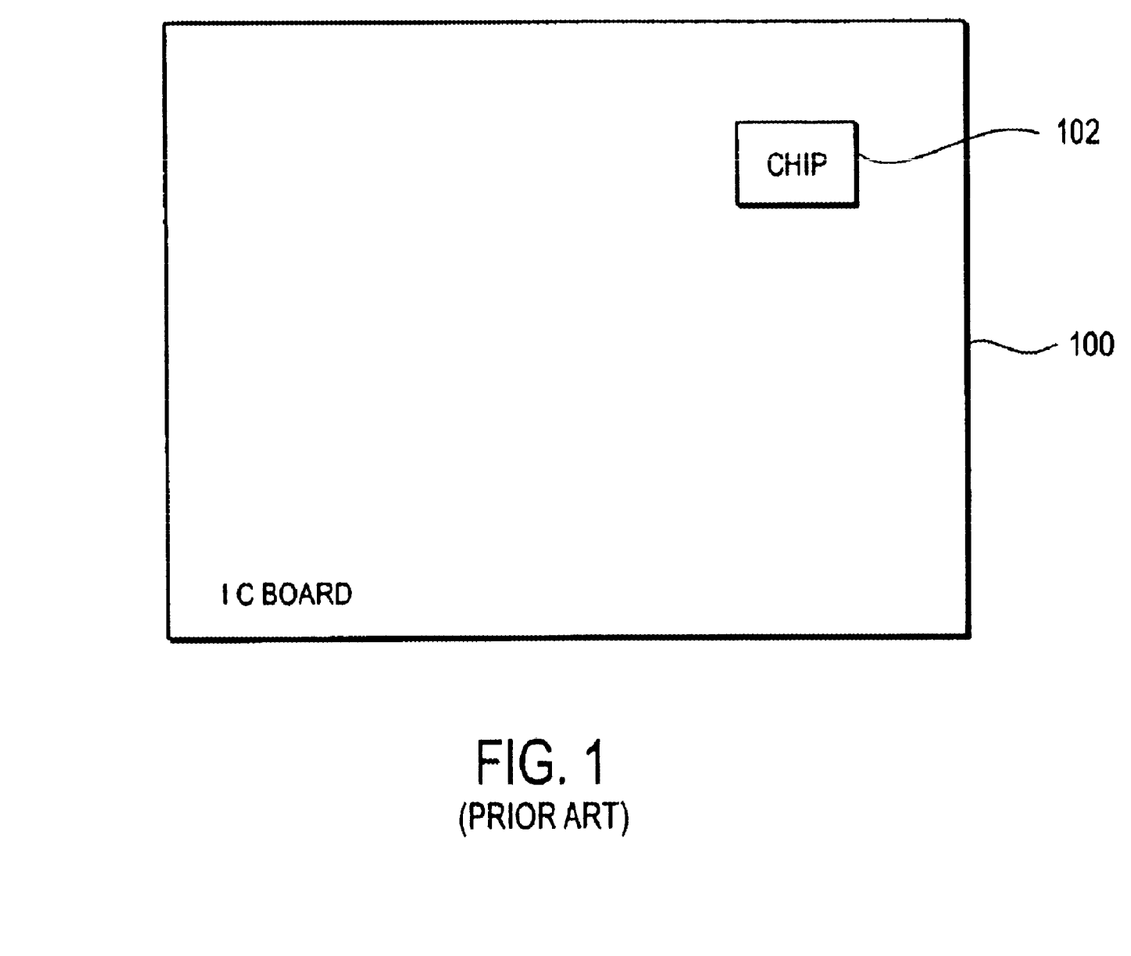
FIG. 1 is a block diagram of an integrated circuit board.

A modern integrated circuit board typically includes multiple microprocessor chips. An example of an integrated circuit (IC) board 100 with a microprocessor chip 102 is shown in FIG. 1. Microprocessor chip 102 actually represents a microprocessor chip contained in an electronic package. An example of such a chip is a commercial microprocessor chip manufactured by Siemens.

Once the microprocessor chip 102 is placed on the IC board 100, it is typically tested to ensure proper performance. However, since the actual chip is typically contained in an electronic package, the microprocessor chip 102 is generally inaccessible. In order to analyze the performance of a chip 102 embedded in an IC board 100, an "in-circuit emulator" is commonly used to emulate the processes of the target chip 102. An "in-circuit emulator" is typically a box of hardware (or plug-in card) which emulates the microprocessor in a target system via a cable connection. The in-circuit emulator can execute code in the target system's memory (typically erasable programmable read only memory (EPROM) or random access memory (RAM)), or it can execute code which has been downloaded to the emulator.

The emulator may monitor everything that is happening in the microprocessor, such as monitoring the contents of registers. For example, the emulator may be asked to check a write cycle to an EPROM's area of memory space to provide a listing of the last one hundred instructions executed before a write-to-EPROM error.

Figure 2:
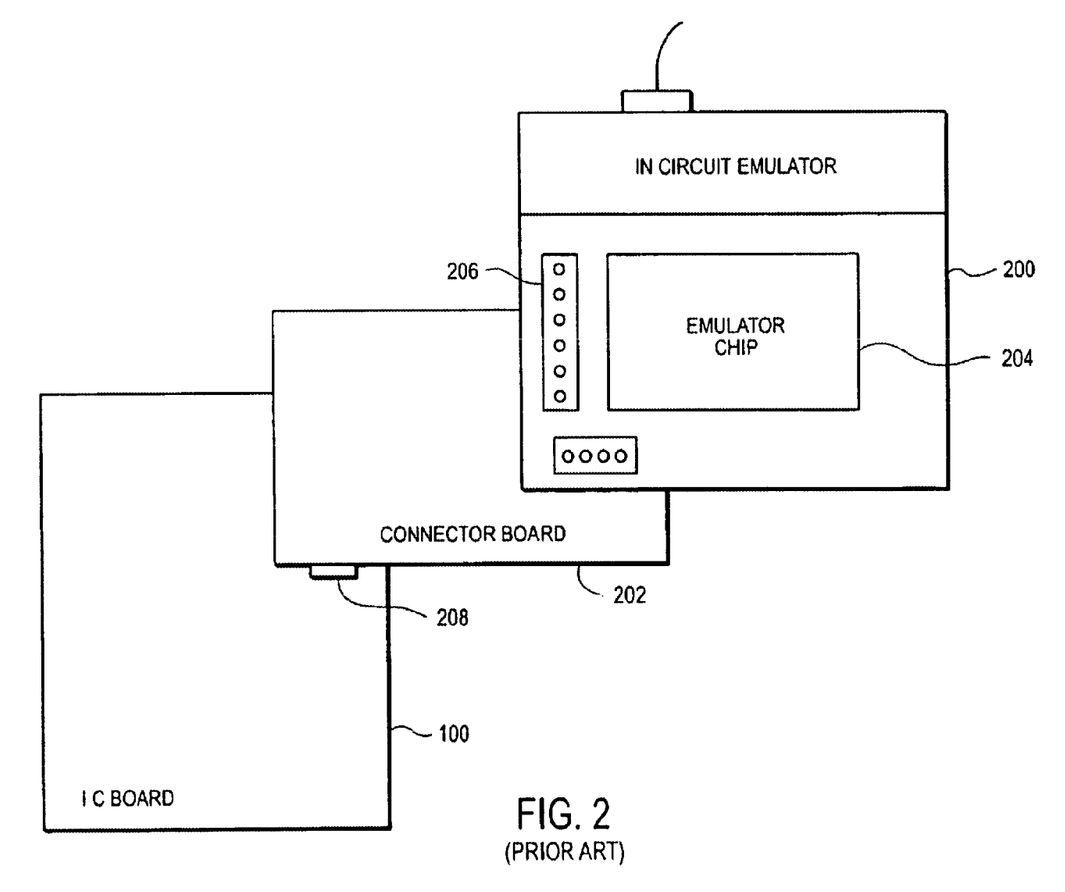
FIG. 2 is a block diagram of an in-circuit emulator coupled with an integrated circuit board.

FIG. 2 shows a block diagram of an example of an in-circuit emulator. FIG. 2 includes an IC board 100 coupled with a connector board 202. IC board 100 would be coupled to the target microprocessor chip under normal conditions. However, during testing and emulation, IC board 100 may be coupled with connector board 202 via a connector 208. The purpose of connector board 202 is to facilitate a connection with an in-circuit emulator 200.

In-circuit emulator 200 is shown to include connectors 206 and an emulator chip 204. In-circuit emulator 200 may be any in-circuit emulator, such as those manufactured by HiTex or Nohau. Emulation chip 204 typically has the same interface with the environment as the target microprocessor chip (102 of FIG. 1) in order to emulate the same processes and functions that target chip 102 would perform. However, emulator chip 204 also typically facilitates extra signals which may be used to trace control and trace problems within emulator chip 204. For example, a target microprocessor chip 102 may contain 100 to 200 connector pins for electronic signals, while emulator chip 204 designed to emulate target chip 102 may include more than 400 connector pins. In order to accommodate the extra connector pins for the signals used during testing, emulator chip 204 is typically very large. The need to accommodate the extra connector pins requires that emulator chip 204 be typically encased in a different sized and shaped electronic package than the target chip's package in order to accommodate the extra connectors.

Since emulator chip 204 is encased in a different package than target chip 102, it is common for the two electronic packages to have an incompatible packaging footprint which typically makes it difficult, if not impossible, to directly place the emulator chip 204 onto IC board 100. A packaging footprint may include factors such as the number of connector pins, the length of the connector pins, the geometry of the package, and distance between the connector pins (pitch). Since emulator chip 204 is typically not directly placed onto IC board 100, long connector lines are typically required to connect emulator chip 204 with IC board 100. An example of the connector line length is approximately five inches. These long lines undesirably slow down the speed of the system.

Another disadvantage of using conventional emulation chip packages is that only a very small number of emulation packages are typically produced. Accordingly, the manufacturing of specially designed emulation packages are typically very expensive since the cost of manufacturing is not absorbed in the volume of produced emulation packages.

It would be desirable to have an emulation chip package which can be manufactured at a reasonable cost. It would also be desirable to have an emulation chip package which has the same or compatible footprint as the target chip such that the emulation chip can be directly coupled to the IC board in place of the target chip. Additionally, it would be desirable to minimize the length of the connectors between the IC board and the emulation chip. The present invention addresses such needs.

SUMMARY OF THE INVENTION

The present invention relates to electronic packaging and a method for manufacturing the same. According to an embodiment of the present invention, an emulator chip package is designed and assembled such that a bottom portion of the emulator chip package is approximately the same electronic package used to package the target chip. Additionally, a top portion of the emulator chip package is approximately a slightly modified version of the same type of package used to package the target chip. According to an embodiment of the present invention, the top portion of the emulator chip package is attached to the bottom portion of the emulator chip package. Connector pins of the top portion of the package preferably leads up, while the connector pins of the bottom portion of the package preferably leads down.

The emulator chip package according to an embodiment of the present invention has approximately the same or compatible footprint as the package of the target chip and thus may directly replace the target chip on the IC board. Additionally, with the addition of the top portion of the emulator chip package, the emulator chip package will have double the number of connector pins as the target chip package. The extra connector pins of the emulator chip package may facilitate the extra signals required for testing and emulation. Alternatively, the extra pins may be used to connect to a printed circuit board which can facilitate extra signals required for emulation.

An electronic package for an emulation chip is presented according to an embodiment of the present invention. The electronic package comprises a first portion of the electronic package, wherein the first portion may be directly coupled with an integrated circuit board. A first set of contacts is coupled with the first portion, the first set of contacts being configured to conduct electrical signals. A second portion of the electronic package is also included, the second portion being coupled to the first portion. A second set of contacts is coupled with the second portion, the second set of contacts being configured to conduct electrical signals.

In another aspect of the present invention, a method for manufacturing an electronic package according to an embodiment of the present invention is presented. The method comprising providing a first electronic package, providing a second electronic package, and attaching the first and second electronic packages together to result in a resulting electronic package.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 3:
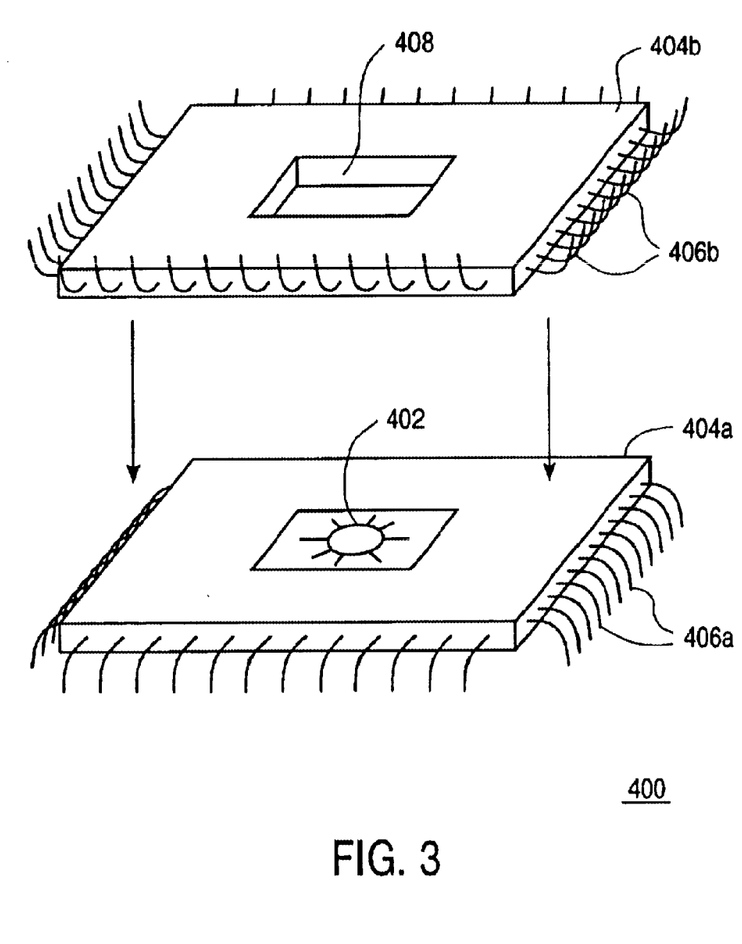
FIG. 3 is a block diagram of an emulator chip package according to an embodiment of the present invention.

FIG. 3 is a block diagram of an emulator chip package according to an embodiment of the present invention. The emulator chip package 400 of FIG. 3 is shown to include a bottom portion 404A of the package and a top portion 404B of the package. Bottom portion 404A is preferably the same package as the target chip package which encases the target microprocessor chip. There are many varieties of packages which may be used to encase a target microprocessor chip. For example, these microprocessor chip packages include packages manufactured by Advanced Micro Devices (AMD), Motorola, Texas Instruments (TI), Intel, and Siemens. An example of a range of the number of connector pins which may be included in a chip package is 40 to 240 pins.

Whatever package is used to encase the target microprocessor chip is preferably the same package that is used as bottom portion 404A of the emulator chip package, according to an embodiment of the present invention. Selection of a package to be used as bottom portion 404A should consider factors of cost, ease of manufacturing, functionality of the connector pins, and footprint being compatible with those of the target microprocessor chip. A package footprint is herein meant to include factors such as the number of connector pins, the length of the connector pins, the geometry of the package, and distance between the connector pins (pitch).

Using the same package as that of the target microprocessor chip would meet all of these criterias. A target microprocessor chip package is typically manufactured in large quantities, thus the additional cost of manufacturing one more for an emulator chip is quite small. A further advantage is that the footprint of bottom portion 404A would be identical to the footprint of the target chip package. Accordingly, bottom portion 404A could be directly placed on the IC board, replacing the target chip.

Alternatively, a package that is similar to the one used to encase the target microprocessor chip may be used as bottom portion 404A. If a similar package is selected, it is preferred that the bottom portion 404A of the emulator chip package have the same or compatible footprint to allow it to directly replace the target chip on the IC board. A compatible package footprint may be any footprint which allows the emulator chip package to directly replace the target chip on the IC board. It is also preferred that if bottom portion 404A is not the same type of package used for the target chip, then it should also be a chip package that is commonly manufactured for another microprocessor chip to ensure ease of manufacturing and minimization of cost.

As shown in FIG. 3, bottom portion 404A of the emulator chip package includes an emulator microprocessor chip 402 located inside bottom portion 404A. Bottom portion 404A also includes a set of connector pins 406A surrounding the perimeter of bottom portion 404A.

Top portion 404B of the emulator chip package may be the same or similar package as that used for bottom portion 404A, according to an embodiment of the present invention. Factors to consider for selection of top portion 404B also include cost and ease of manufacturing, but the footprint does not have match the footprint of the target chip package since top portion 404B does not directly couple to the IC board. A package used for the target chip meets these criterias, as does most packages manufactured for microprocessor chips.

Top portion 404B includes a hole 408 which approximately matches the location of emulator microprocessor chip 402. Upper portion 404B also includes a set of connector pins 406B around the perimeter of top portion 404B. Connector pins 406B of top portion 404B are preferably angled up away from bottom portion 404A. Likewise, it is preferable that connector pins 406A of bottom portion 404A are angled away from top portion 404B. This angling can be accomplished by simply taking two conventional packages and facing them in opposite directions such that connector pins face away from each other.

Top portion 404B and bottom portion 404A are attached together such that a planar surface of top portion 404B and a planar surface of bottom portion 404A are attached together, preferably with their perimeters approximately aligned with each other. The attachment may be made with any bond commonly used in packaging technology, such as glue. Once top portion 404B is attached to bottom portion 404A, emulator chip package 400 will have approximately double the number of connector pins 406A–406B than the number of connector pins located on the target chip package. The extra pins may be used for conducting the additional signals required during emulation and testing.

Figure 4:
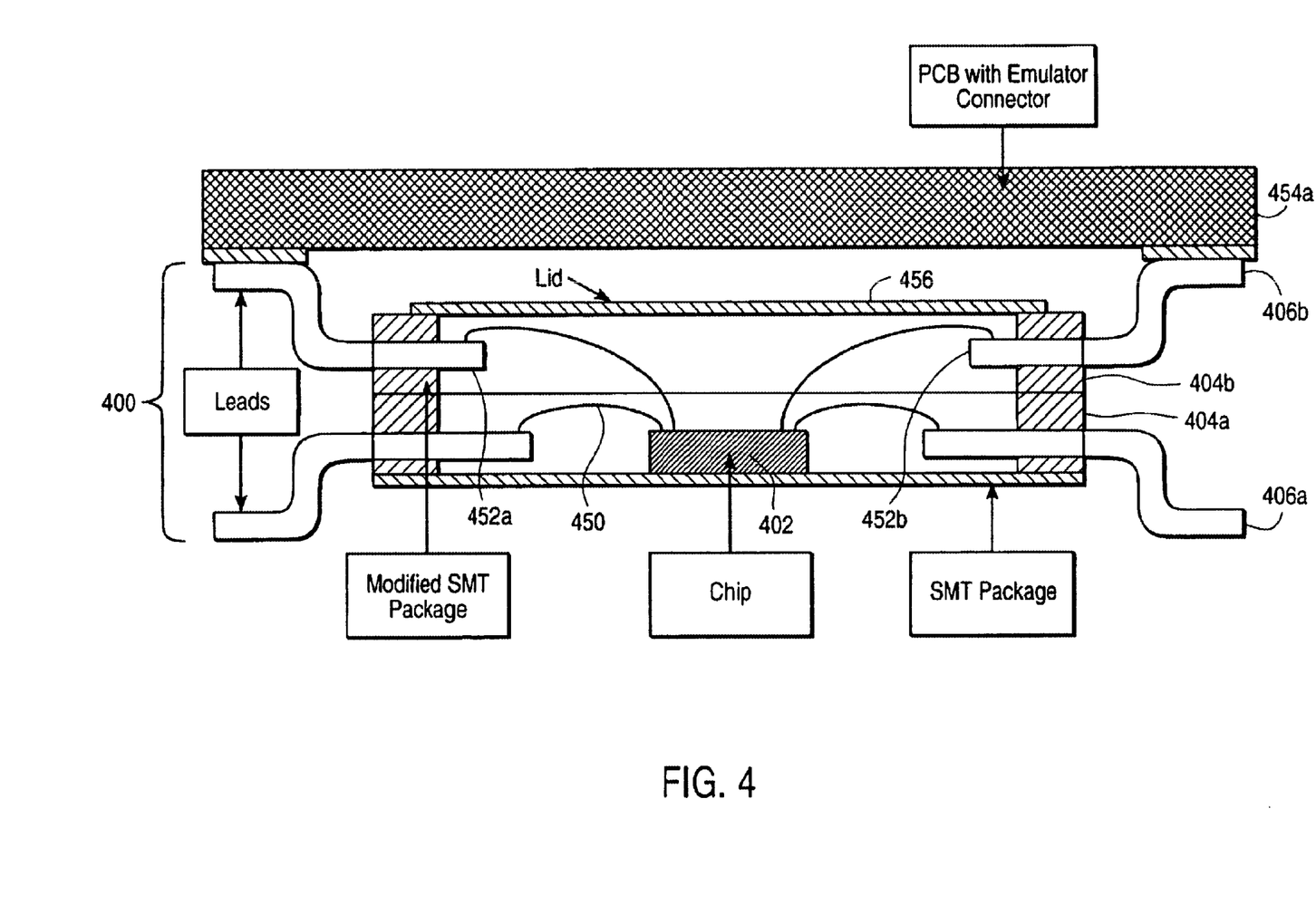
FIG. 4 is a cross sectional view of an emulator chip package according to an embodiment of the present invention.

FIG. 4 is a cross sectional view of the emulator chip package 400 according to an embodiment of the present invention. Bottom portion 404A is shown to include emulator microprocessor chip 402 connected to connector pins 406A of bottom portion 404A via connectors 450. Emulator microprocessor chip 402 is also connected through connectors 450 to the top row of connector pins 406B of top portion 404B.

It is optional to slightly reduce the length of inner portion 452A–452B of the top row of connector pins 406B. If the inner portions 452A–452B are shortened, then a connector device may attach connectors 450 between emulator microprocessor chip 402 and connector pins 406B–406A in one session since the device would be able to reach the lower row of connector pins 406A as well as the top row of connector pins 406B. Once emulator microprocessor chip 402 has been placed within bottom portion 404A through hole 408 of FIG. 3, connectors 450 are in place, and top portion 404B and bottom portion 404A have been attached, a lid 456 may be placed on top of top portion 404B to enclose emulator microprocessor chip 402.

A printed circuit board (PCB) 454A with emulator connectors may be placed on top of emulator chip package 400 to facilitate communication to and from an emulation computer. PCB 454A may be coupled to the emulator chip package 400 in any manner commonly used for coupling electrical packages to a PCB, such as soldering. Further details of PCB 454A will later be discussed in conjunction with FIG. 6.

Figure 5:
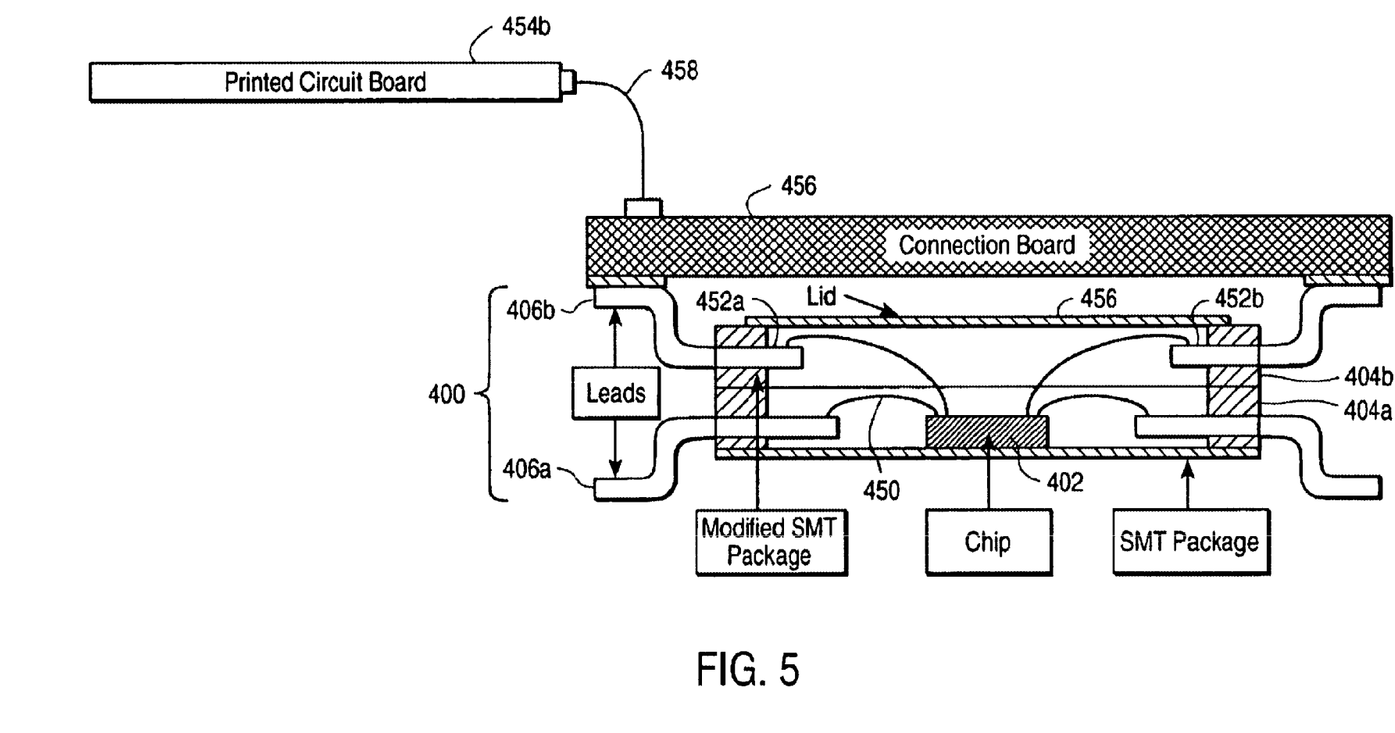
FIG. 5 is a cross sectional view of the emulator chip package coupled with a printed circuit board, according to an embodiment of the present invention.

FIG. 5 shows an alternate embodiment of the coupling between emulator chip package 400 and printed circuit board 454B. Emulator chip package 400 may be connected to a connection board 456 which in turn is coupled with the printed circuit board 454B. Connection board 456 simply facilitates connection between emulator chip package 400 and PCB 454B. It channels signals between PCB 454B and upper connector pins 406B. Connection board 456 is shown to be connected to PCB 454B through a connector 458. Connector 458 may be a flexible connector such as a connector ribbon, or a rigid connector. An example of an appropriate connector ribbon is a connector ribbon manufactured by 3M or AMP. Connector 458 is preferably as short as possible. For example, the length of connector 458 may be approximately 3–5 inches.

Figure 6:
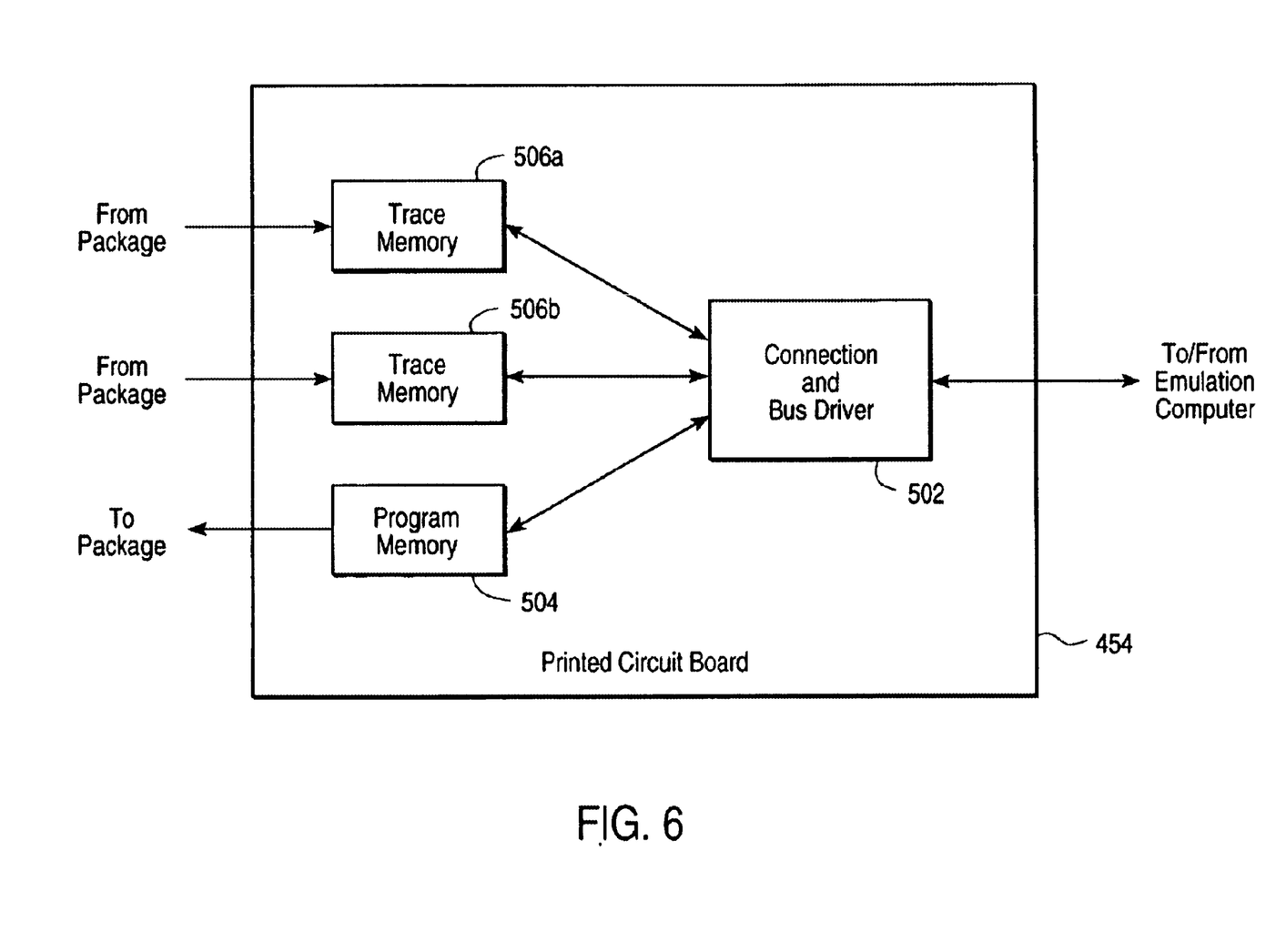
FIG. 6 is a block diagram of a printed circuit board which may be used in conjunction with the emulator chip package according to an embodiment of the present invention.

FIG. 6 is a block diagram of a printed circuit board, such as printed circuit board 454A of FIG. 4 and 454B of FIG. 5. Printed circuit board (PCB) 454 is shown to include a connector and a bus driver 502 which facilitates communication to and from an emulation computer (not shown). Connector and bus driver 502 is also shown to be coupled with two trace memories 506A–506B. These trace memories 506A–506B may be dual port memories which read from one side and write from another. The specifics of trace memories 506A–506B depend on various implementations. Examples of trace memories 506A–506B may be random access memories (RAMs) with 128 by 10K or 256 by 10K bit width.

Trace memories 506A–506B may perform a real-time trace to produce a log of instructions. For example, they may record every status information and clock information. Trace memories 506A–506B receive data from emulator chip package 400 and are read from the emulation computer through connector and bus driver 502.

Connector and bus driver 502 is also shown to be coupled with a program memory 504. Program memory 504 receives instructions from the emulation computer through connector and bus driver 502. The emulator chip then reads these instructions from program memory 504 during emulation of a target microprocessor chip. Examples of program memory 504 include a dual port RAM or erasable programmable memory (EPROM) with 256 Kb or 512 Kb.

Figure 7:
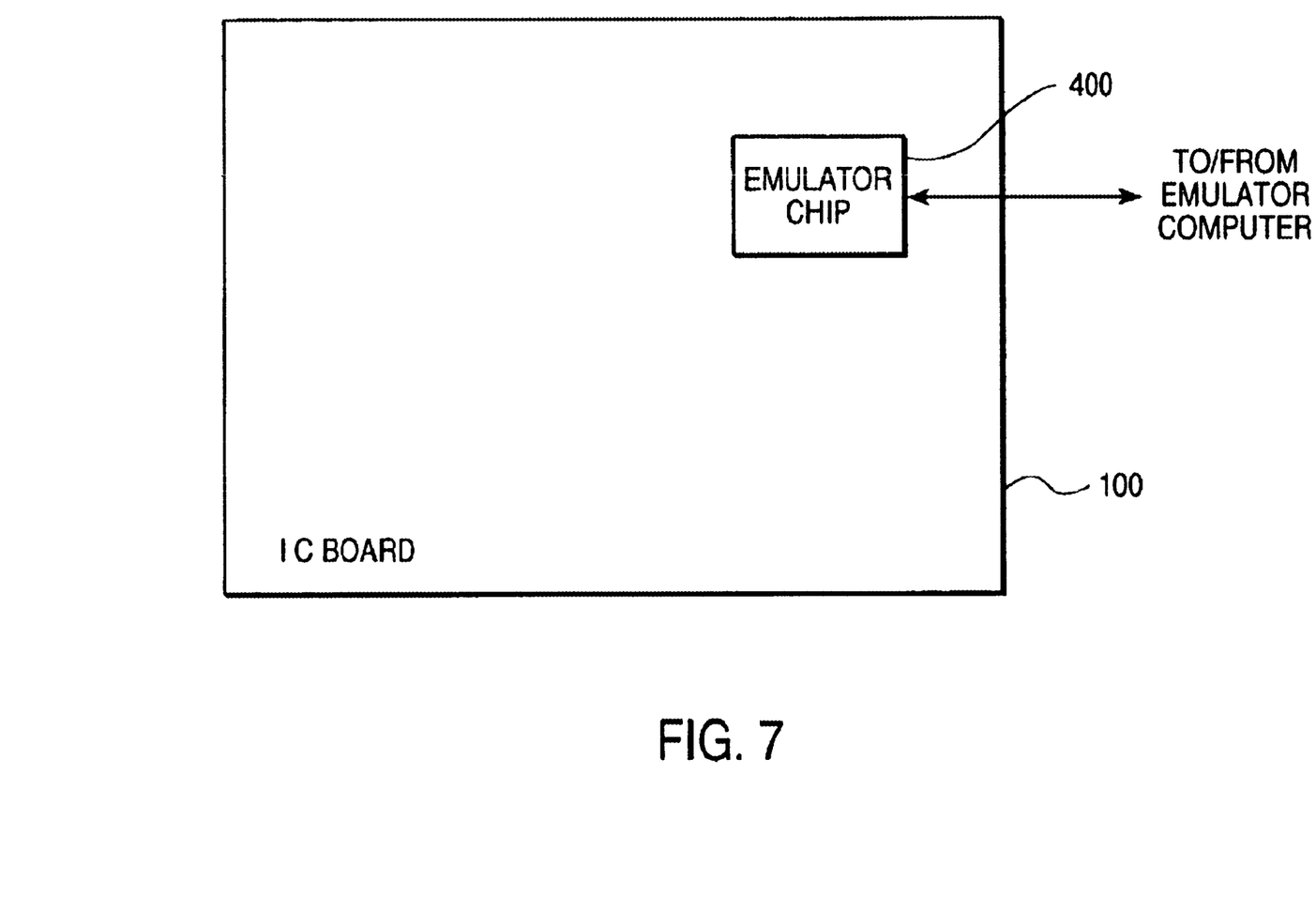
FIG. 7 is a block diagram of an integrated circuit board with an emulator chip located directly on it according to an embodiment of the present invention.

FIG. 7 is a block diagram of an integrated circuit (IC) board 100 with an emulator chip package 400 (encasing an emulator chip) directly connected to IC board 100 according to an embodiment of the present invention. Emulator chip package 400 may be directly connected to IC board 100 in the same location as a target chip would have been connected to IC board 100. Emulator chip package 400 would be coupled to an emulation computer (not shown) such that signals may be communicated to and from emulator chip package 400. By being directly coupled to IC board 100, long connection lines and extra connectors to connect to emulator chip package 400 may be avoided.

Figure 8:
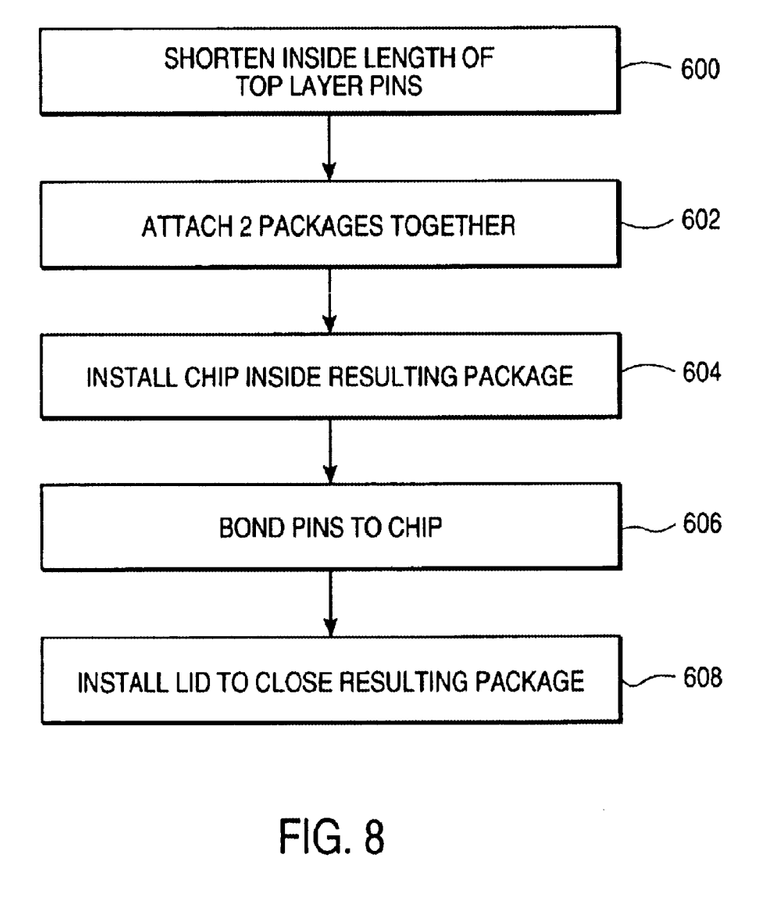
FIG. 8 is a flow diagram of a method for manufacturing an emulator chip package according to an embodiment of the present invention.

FIG. 8 is a flow diagram illustrating an example of a method according to an embodiment of the present invention for manufacturing an emulator chip package. The method shown in FIG. 8 is merely an example and many variations of the steps shown may be implemented. For example, the order of many of the steps may be changed and still produce the same effect.

The method exemplified in FIG. 8 begins with the inside length of top layer connector pins being shortened (step 600). For example, inside length 452A–452B of the top layer connector pins 406B of FIG. 5 are shortened. Two packages are then attached together (step 602). Preferably, the bottom package (i.e., the package that is to be directly coupled with the IC board) is the same or substantially similar to the package encasing a target microprocessor chip. As previously discussed, the top package (i.e., the package that is not intended to be directly coupled to the IC board) may also be the same or similar to the package used for the target microprocessor chip.

An emulator microprocessor chip is then installed inside the two attached packages, resulting in a combined package (step 604). Connector pins are then bonded to the emulator microprocessor chip from the combined package (step 606). A lid is then installed to close the resulting combined package (step 608).

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. An electronic package for an emulation chip associated with a target chip having a target chip electronic package with contacts, the contacts being located only along one or more perimeter edges of the target chip electronic package, the electronic package comprising:

a first portion having a substantially similar design as a bottom portion of the target chip electronic package, the first portion adapted to being directly connected to an integrated circuit board and wherein the first portion includes a first set of contacts that substantially match all of the contacts of the target chip electronic package, the first set of contacts being located only along one or more perimeter edges of the first portion;

a second portion coupled with the first portion, wherein the second portion has a second substantially similar design as the bottom portion of the target chip electronic package and wherein the second portion includes a second set of contacts that substantially match all of the contacts of the target chip electronic package, the second Set of contact being located only along one or more perimeter edges of the second portion, the second set of contacts not being directly electrically coupled to the first set of contacts; and an emulation chip designed to emulate functions of the target chip, the emulation chip secured in the first portion and electrically connected to the first set of contacts and the second ser of contacts.

2. An electronic package as in claim 1 wherein said first portion has a footprint that is compatible with a second footprint associated with said target chip electronic package.

3. An electronic package as in claim 1 wherein said first set of contacts and said second set of contacts are angled away from each other.

4. An electronic package as in claim 1, wherein an inside length of the second set of contacts are shorter than an inside length of the first set of contacts.

5. An electronic package as in claim 1, wherein the second portion is configured to couple with a printed circuit board.

6. An electronic package as in claim 5, wherein the printed circuit board includes a trace memory.

7. An electronic package as in claim 5, wherein the printed circuit board includes a program memory.

8. An electronic package as in claim 5, wherein the printed circuit board includes a connector for coupling to an emulator computer.

9. An electronic package for an emulation chip associated with a target chip having a target chip electronic package with contacts, the contacts being located only along one or more perimeter edges of the target chip electronic package, the electronic package comprising:

a first portion being substantially similar in design to a bottom portion of the target chip electronic package, the first portion adapted to being directly connected to an integrated circuit board and including a first set of contacts that substantially match all of the contacts of the target chip electronic package, the first set of contacts being located only along one or more perimeter edges of the first portion;

a second portion coupled to the first portion, the second portion being substantially similar in design to the bottom portion of the target chip electronic package and including a second set of contacts that substantially match all of the contacts of the target chip electronic package, the second set of contact being located only along one or more perimeter edges of the second portion, the second set of contacts not being directly electrically coupled to the first set of contacts, wherein the second portion includes a hole to accommodate the emulation chip; and an emulation chip designed to emulate functions of the target chip, the emulation chin secured in the first portion and electrically connected to the first set of contacts and the second set of contacts.

10. An emulation chip package associated with a target chip having a target chip electronic package with contacts, said emulation chip package comprising:

a first portion being substantially similar in design to a bottom portion of said target chip electronic package, said first portion adapted to being directly connected to an integrated circuit board and including a first set of contacts that substantially match all of the contacts of said target chip electronic package;

a second portion coupled to said first portion, said second portion being substantially similar in design to said bottom portion of said target chip electronic package and including a second set of contacts that substantially match all of the contacts of said target chip electronic package; and an emulation chip designed to emulate functions of said target chip, said emulation chip secured in said first portion and electrically connected to a plurality of said first set of contacts and a plurality of said second set of contacts.

11. An emulation system for analyzing performance of an integrated circuit board, said emulation system comprising:

an emulation chip package associated with a target chip having a target chip electronic package with contacts, said emulation chip package including:

a first portion being substantially similar in design to a bottom portion of said target chip electronic package, said first portion adapted to being directly connected to an integrated circuit board and including a first set of contacts that substantially match all of the contacts of said target chip electronic package;

a second portion coupled to said first portion, said second portion being substantially similar in design to said bottom portion of said target chip electronic package and including a second set of contacts that substantially match all of the contacts of said target chip electronic package; and an emulation chip designed to emulate functions of said target chip, said emulation chip secured in said first portion and electrically connected to a plurality of said first set of contacts and a plurality of said second set of contacts;

an integrated circuit board coupled to said first set of contacts, said integrated circuit board being designed to receive said target chip;

an emulation computer designed to analyze said performance of said integrated circuit board; and a printed circuit board coupled to said second set of contacts, said printed circuit board being designed to facilitate communication to and from said emulation computer.

* * * * *

UNITED STATES PATENT AND TRADEMARK OFFICE
CERTIFICATE OF CORRECTION

PATENT NO. : 6,668,242 B1
DATED : December 23, 2003
INVENTOR(S) : Andrea Wenzel and Boris Reynov It is certified that error appears in the above-identified patent and that said Letters Patent is hereby corrected as shown below:

Title page,
Item [56], References Cited, U.S. PATENT DOCUMENTS, please delete "5,325,512" and insert -- 5,325,521 -- therefor.

Column 7,
Line 5, please delete "Set" and insert -- set -- therefor.
Line 12, please delete "ser" and insert -- set -- therefor.
Line 57, please delete "chin" and insert -- chip -- therefor.

Column 8,
Line 34, before "target" please delete "said" and insert -- the -- therefor, after "package" and before ";" please insert -- , the first set of contact being located only along one or more perimeter edges of the first portion --.
Line 40, after "package" and before ";" please insert -- , the second set of contact being located only along one or more perimeter edges of the second portion --.
Line 54, after "from" please delete "said" and insert -- the -- therefor.

Signed and Sealed this

Nineteenth Day of October, 2004

JON W. DUDAS
*Director of the United States Patent and Trademark Office*